United States Patent
Smayling et al.

(10) Patent No.: US 6,191,976 B1
(45) Date of Patent: Feb. 20, 2001

(54) FLASH MEMORY MARGIN MODE ENHANCEMENTS

(75) Inventors: Michael C. Smayling, Sunnyvale, CA (US); Giulio G. Marotta, Rieti; Giovanni Santin, Santa Rufina, both of (IT)

(73) Assignee: Texas Instruments Incorporated, Dallas, TX (US)

( * ) Notice: Under 35 U.S.C. 154(b), the term of this patent shall be extended for 0 days.

(21) Appl. No.: 09/372,730

(22) Filed: Aug. 11, 1999

(30) Foreign Application Priority Data

Aug. 13, 1998 (IT) .............................. RM98A0544

(51) Int. Cl.[7] .................................................. G11C 16/06
(52) U.S. Cl. .................. 365/185.2; 365/185.21; 365/185.33
(58) Field of Search ........................ 365/185.2, 185.03, 365/185.21, 210, 185.22, 207, 185.33

(56) References Cited

U.S. PATENT DOCUMENTS

| | | | |
|---|---|---|---|
| 5,654,919 | * 8/1997 | Kwon | 365/185.21 |
| 5,917,753 | * 6/1999 | Dallabora et al. | 365/185.21 |
| 5,973,957 | * 10/1999 | Tedrow | 365/185.03 |

* cited by examiner

*Primary Examiner*—David Nelms
*Assistant Examiner*—David Lam
(74) *Attorney, Agent, or Firm*—William B. Kempler; Frederick J. Telecky, Jr.

(57) ABSTRACT

FLASH Memory sense amplifier reference circuit with weighted dummy loads is used to balance and bias the sense amplifier during erasing, programming, and verification such that the resulting robust stored logic states can meet more stringent pass-fail verify "1" or verify "0" tests. Programming in this manner guarantees logic states which meet full operating temperature and full power supply tolerances requirements.

4 Claims, 6 Drawing Sheets

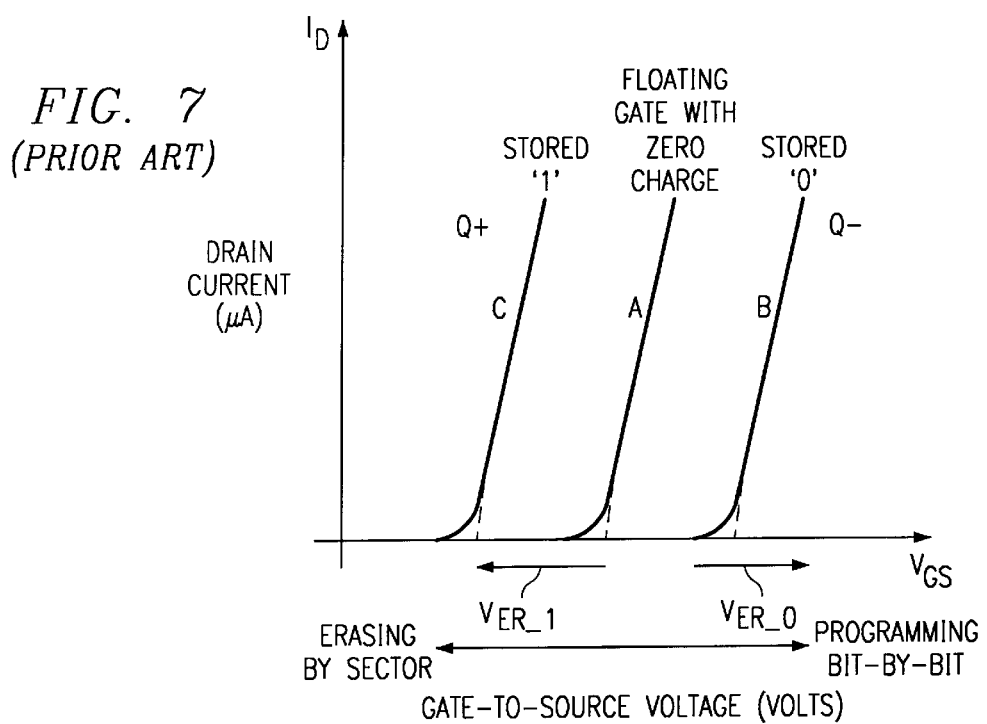
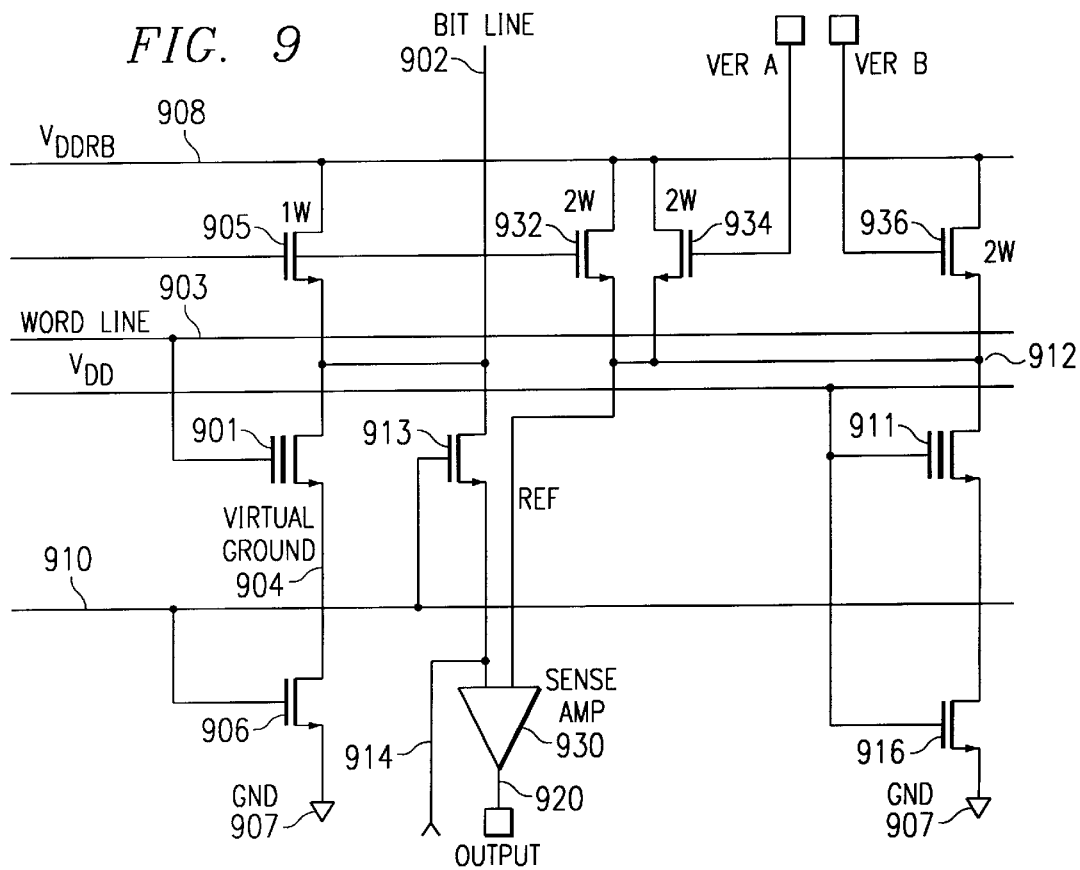

FIG. 8

| FUNCTION | SELECTED WORD LINE | DESELECTED WORD LINE | SELECTED BIT LINE | DESELECTED BIT LINE | BACK GATE (ISOLATED P-WELL) | SELECTED SOURCE LINE SELECTED SEGMENT LINE | VIRTUAL GROUND |
|---|---|---|---|---|---|---|---|
| PROGRAM (WRITE '0') (BYTE-BY-BYTE) | ~10–12 VOLTS | ~0 VOLTS | 6–7 VOLTS | FLOAT | ~0 VOLTS | ~0 VOLTS | ~0 VOLTS |
| SECTOR OR BLOCK ERASE (WRITE '1') | ~0 VOLTS | ~15 VOLTS | FLOAT | FLOAT | ~15 VOLTS | FLOAT | FLOAT |
| READ (NORMAL VERIFICATION) | 5 VOLTS | ~0 VOLTS | 1.2 VOLTS | FLOAT | ~0 VOLTS | ~0 VOLTS | ~0 VOLTS |
| FLASH WRITE | ~12 VOLTS | N/A | ~0 VOLTS | N/A | ~0 VOLTS | ~0 VOLTS | ~0 VOLTS |

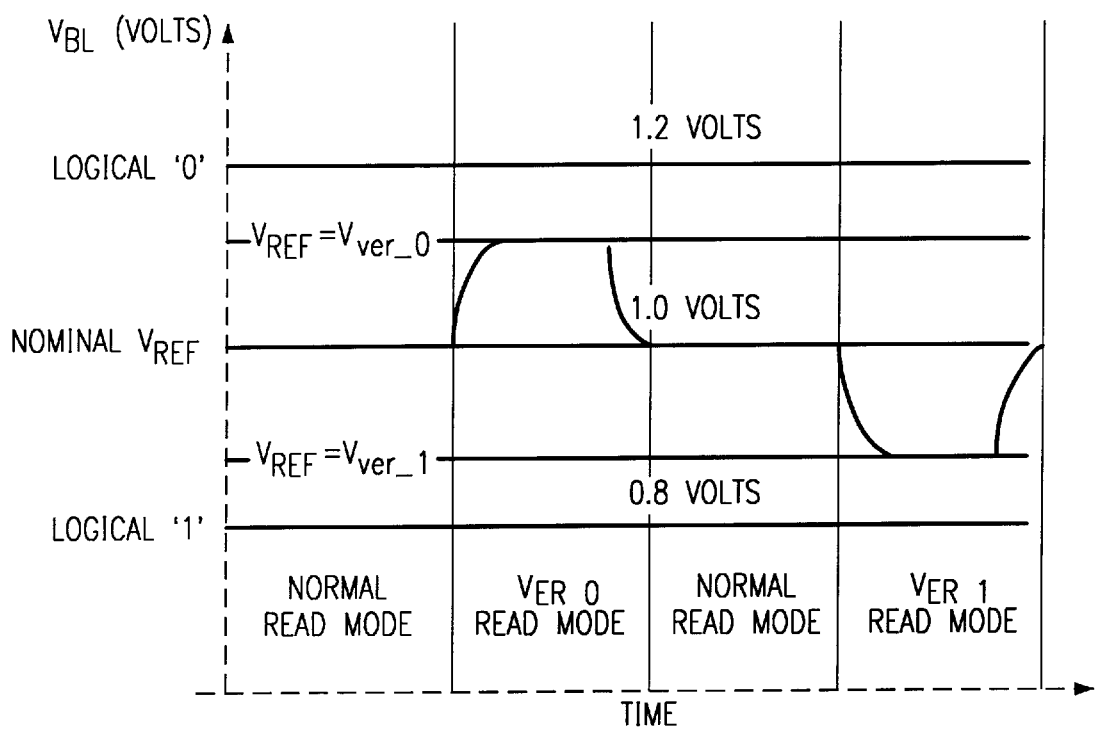

FLASH MEMORY MARGIN MODE ENHANCEMENTS

TECHNICAL FIELD OF THE INVENTION

The technical field of this invention is flash memory and particularly structures and methods to improve programming margins.

BACKGROUND OF THE INVENTION

Semiconductor memories of several types have become key support hardware for today's computer systems. While DRAM (dynamic random access memory) has been used mainly in the form of dedicated chips, most of the other types have been employed both as dedicated chips and as embedded memory, located on the main central processing unit chip.

These other types include: (1) SRAM (static random access memory), (2) ROM (read-only memory), (3) EPROM (electrically programmable read-only memory), (4) EEPROM (eraseable electrically programmable read-only memory), and (5) FLASH (an acronym meaning simply "high speed eraseable, electrically programmable read-only memory"). The last three, EPROM, EEPROM, and FLASH use basically similar device technology process steps and device structure at the heart of the memory element. The key device is a dual-gate NMOS transistor. A first gate, called the control gate, is normally connected to the circuit node which electrically drives it. A second gate is floating electrically and is used to hold a charge. This charge can be altered electrically by applying a combination of specific values of impressed voltages on the normal gate and source/drain terminals. The charge present on the floating gate determines whether a logical "0" or a logical "1" is stored at the cell location of the floating gate transistor.

This floating gate structure is a compact device. The precision process from which it is formed provides a transistor well controlled in its characteristics. There are three basic differences of the FLASH structure over the EPROM structure. In the FLASH structure the geometric details around the periphery and within the active area of the gates have been modified to make the device more amenable to programming in-sitsu, that is programming while the device is located in its application socket. The gate oxide thickness has been reduced in the FLASH memory element transistor. This allows for charge tunnelling to occur and makes possible channel erasing. In channel erasing the central active area of the channel participates in the erasing rather than only at the active gate periphery. The FLASH device also includes additional required biasing circuitry to allow erasing.

In order of historical sequence, the PROM was first used for read-only memory applications and the devices were programmed by a masking operation. In order to satisfy the need for custom programming with short turn-around time at the user's location, the EPROM was developed next. Such EPROMs can be erased only by UV light, thus the and packages have to be transparent. This, by its nature, ruled out embedded processor usage, as the embedded processors can not be encased in such packages.

The EEPROM was developed next and it allowed electrical erasing without UV light. The EEPROM required an extra transistor for select in each cell and this made the chip area per cell too costly. The FLASH memory cell surmounts all the objections, giving excellent performance and excellent cell density. The conventional FLASH memory remains the solution of choice in read-only memory applications.

The FLASH memory also has seen needed incremental technology improvements, leading to better producibility, reliability, and performance. Ease of programming is also an area undergoing continued investigation and experimentation. Texas Instruments FLASH memory devices differ in two important respects from other FLASH memory devices being produced.

First, some prior art FLASH memories use N-epitaxial structures or even simple P-substrate structures, which do not allow for selective bias to the back-gate of a cell. FIG. 1 shows such an N-epitaxial structure. Selective bias cannot be applied to the N-epitaxial back-gate which is common to all devices. FIG. 2 shows the Texas Instruments prior art device structure, a P-substrate epitaxial structure having an N-well back gate. This back gate has several advantages leading to the possibility of generating isolated components for effective circuit use, but most notably, enables a simple "block or sector" pre-programming step which erases either blocks or sectors of the whole array at once. Blocks and sectors are illustrated in FIG. 3. FIG. 3 illustrates three common organizations for FLASH memories. In the block configuration all locations are erased at once in a block erase operation. In the boot-block configuration, addressing may be directed to the programming sector or the boot block sector. Therefore, this configuration is suited to sector erase. In the fully sectored configuration, the erasing is carried out individually in multiple sectors. Conventional FLASH memories are committed to more complex erasing on a byte-by-byte basis. Secondly, Texas Instruments arrays use a switched "source select" line, operating to apply a virtual ground only to those bits being programmed or READ.

A typical prior art FLASH memory circuit configuration is shown in FIG. 4. The memory cell consists of (a) the floating gate N-Channel transistor 401 and (b) associated bit line 402 drive, word line 403, drive and virtual ground 404, and switch circuitry 406. FIG. 5 illustrates an array of such memory cells. These are normally arranged in groups of either 16 or 32 columns. These groups have a common sense amplifier such as 533, and either 8 or 16 sense amplifiers 533, 537, 538 and 539 form one eight-bit byte or one sixteen-bit word of output data.

During in programming or erasing sense amplifier 533 is used to verify that the correct logical state is stored at the desired location. In application usage for reading, sense amplifier 533 is used to detect the desired data and provide interface from the limited drive strength of the memory cell to a CMOS (or TTL) output buffer to the chip terminals or the embedded function's internal terminals. FIG. 6 shows eight bits in detail, four least significant bits (LSB) and four significant bits (MSB) of a sixteen or thirty-two bit column group. Two words are shown, word 0 and word N.

The floating gate N-Channel transistor (401 of FIG. 4) has the characteristics illustrated in FIG. 7. When this transistor has a zero charge on its floating gate, the transistor has the I-V (current-voltage) characteristic of curve "A". With a negative charge "Q$^-$" on the floating gate, the I-V characteristic shifts to curve "B". With a positive charge "Q$^+$" on the floating gate, the I-V characteristic shifts to curve "C".

Programming consists of addressing a particular word line 403 and a particular bit line 402. An appropriate voltage higher than the normal operational voltage is impressed on that word line. Simultaneously, the addressed bit line 402 is driven with the voltage required to charge the floating gate to value Q$^-$ (FIG. 7) associated with storing the desired logic "0" level. Similarly, channel erasing by block or sector consists of addressing all appropriate bits simultaneously and impressing an appropriate voltage higher than the normal operational voltage on the back gate line while simultaneously driving the word line to zero volts. This results in a charge Q+ (FIG. 7) on the floating gate, thus storing the desired logic "1" level.

Programming and erasing are normally carried out by applying pulses to the word line or the bit line requiring the higher voltage. The appropriate voltages are illustrated in the table of FIG. 8. By convention, the term "programming" is synonymous with writing "0" and "erasing" is synonymous with writing "1".

The "READ (normal verification)" operation shown in FIG. 8 verifies that programming has been successful. If the first group of programming pulses does not yield the desired result, additional pulses (a second pass) may be applied. This frequently will drive the floating gate charge to the desired level. Excessive passes of this type could degrade the device, and thus should be avoided if possible. For this reason, it is highly desirable to use precise methods to verify that an adequate number high voltage pulses have been applied to give the "bit" a robust logic level over all operating conditions, while using no more programming pulses than necessary.

Impressing extreme voltage levels on the device alters the energy bands of the silicon-polysilicon-oxide-nitride interfaces. This enables the so called "fortunate" electrons at the higher end of the energy distribution to scale the energy barrier and transfer charge to or from the floating gate can occur. Under normal voltage stress this floating gate is totally isolated by up to the level of $10^{12}$ ohm-cm or higher of dielectric resistivity from the other device terminals. Similarly ultra-violet light can be used on wafers or chips packaged in a transparent package to erase the stored logic levels by removing all the charge on the floating gate. This process proceeds by a "hot electron" mechanism in which stored charges are imparted with sufficient energy to simply cause them to "jump" over the containing energy barriers which held them on the floating gate.

SUMMARY OF THE INVENTION

This invention relates to techniques for programming FLASH memories which result in additional margin in the logic levels of the programmed "bit" cells. While the techniques of prior art can verify that the correct logical level is programmed for a limited set of conditions, such as nominal supply voltage and ambient temperature, the problem of assuring complete compliance to the specification over full power supply tolerance and full operating temperature range is significantly more difficult.

The present invention introduces a weighted pair of transistor loads in the sense amplifier reference circuit to replace the simple dummy load which has been used in the prior art. The weighted loads are switched into the reference circuit according to a prescription to be covered later and at each programming or erasing step a stringent pass-fail test is made to attain the additional margin.

While programming, erasing and verification are carried out at "room temperature" and "nominal supply voltage", the enhanced margins can be shown to guarantee adherence to specification margins over the full range of power supply voltage and operating temperature. This is done by actual correlation testing (comparing ambient room temperature testing at enhanced limits to full temperature, full power supply voltage testing at actual specification limits) on a sufficient process sample.

BRIEF DESCRIPTION OF THE DRAWINGS

These and other aspects of this invention are illustrated in the drawings, in which:

FIG. 7 describes the current-voltage (I-V) characteristics of a floating gate transistor of the prior art with the charge on floating gate as a parameter;

FIG. 8 gives a table of applied voltage conditions at the bit line, word line, and back-gate terminals and virtual ground state for Program, Erase and READ according to the prior art and the conditions applied for testing for Bit Line Stress testing according to the Prior Art, FLASH write "1" according to the Prior Art and Sector or Block Clearing according to this invention;

FIG. 9 illustrates the FLASH memory sense amplifier reference circuit of the present invention, showing the detailed connection of the weighted load transistors in the reference circuit;

FIG. 10 illustrates the conditions for $V_{BL}$, reflecting a logical "1" or a logical "0" as compared to a typical $V_{REF}$ of 1.0 volts; and FIG. 11 illustrates the combinations of weighted load switching for the three operations: verify(1), verify(0) and READ according to this invention, such switched weighted loads at the sense amplifier reference input during these operations resulting in increased memory mode margins.

DETAILED DESCRIPTION OF PREFERRED EMBODIMENTS

Figure 1:
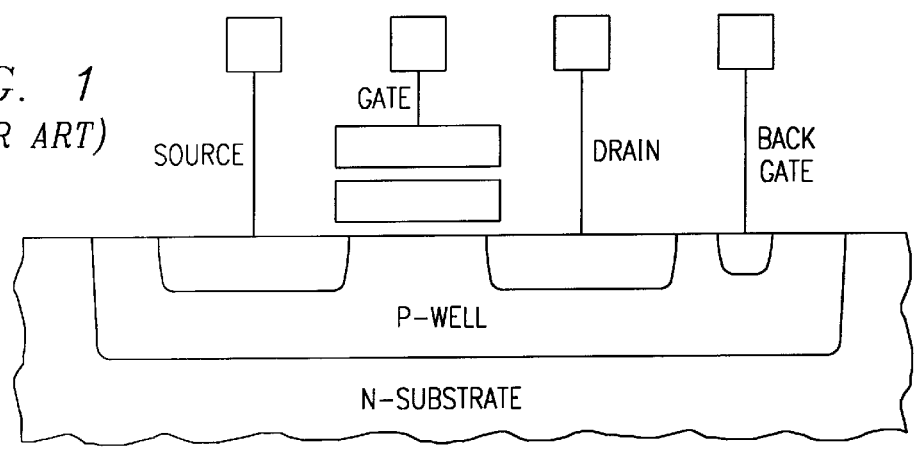
FIG. 1 illustrates the structure of a prior art N-epitaxial FLASH memory process structure.
Figure 2:
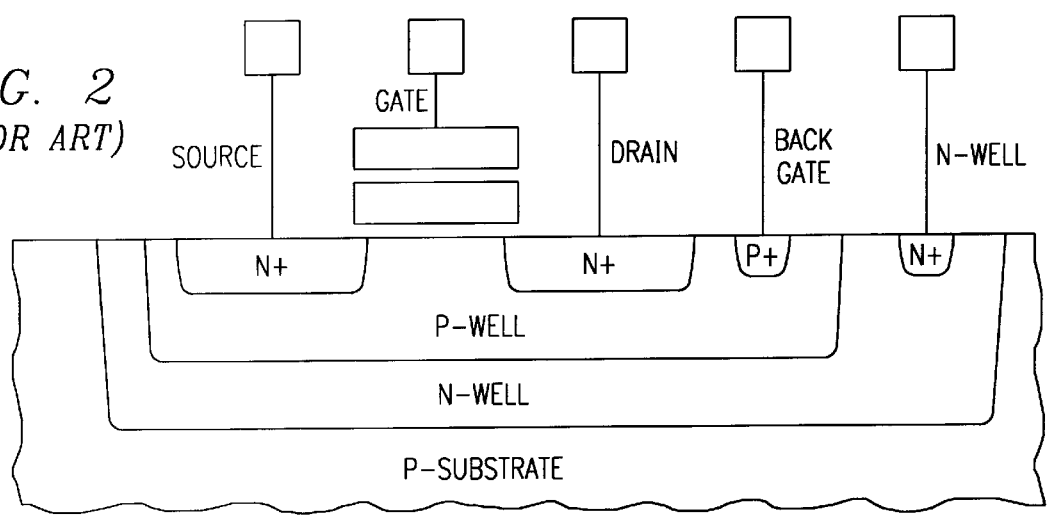
FIG. 2 illustrates the prior art structure of the Texas Instruments P-epitaxial substrate process in comparison to other FLASH memory process structures.
Figure 3:
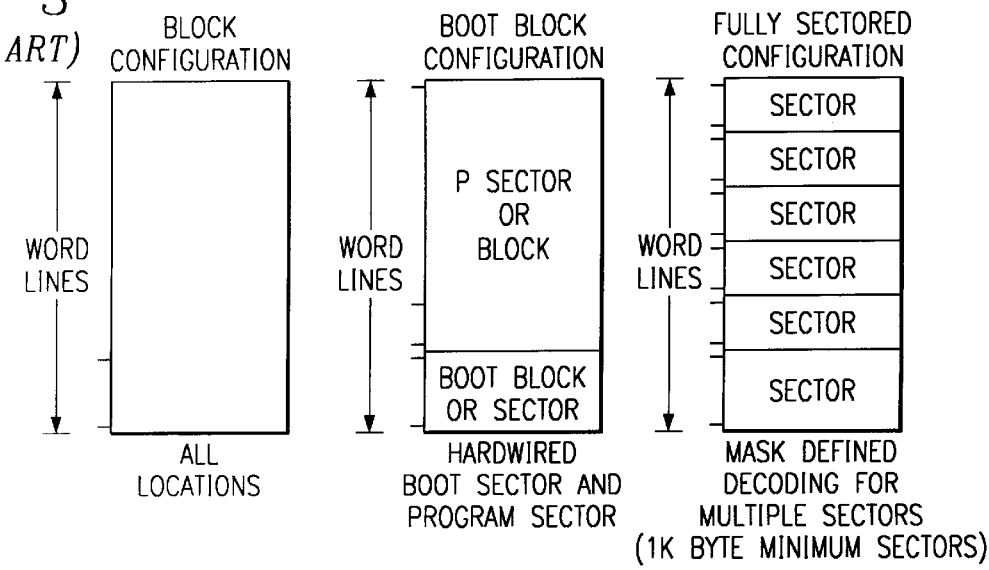
FIG. 3 illustrates the prior art concept of block, boot block and fully sectored FLASH memory configurations.
Figure 4:
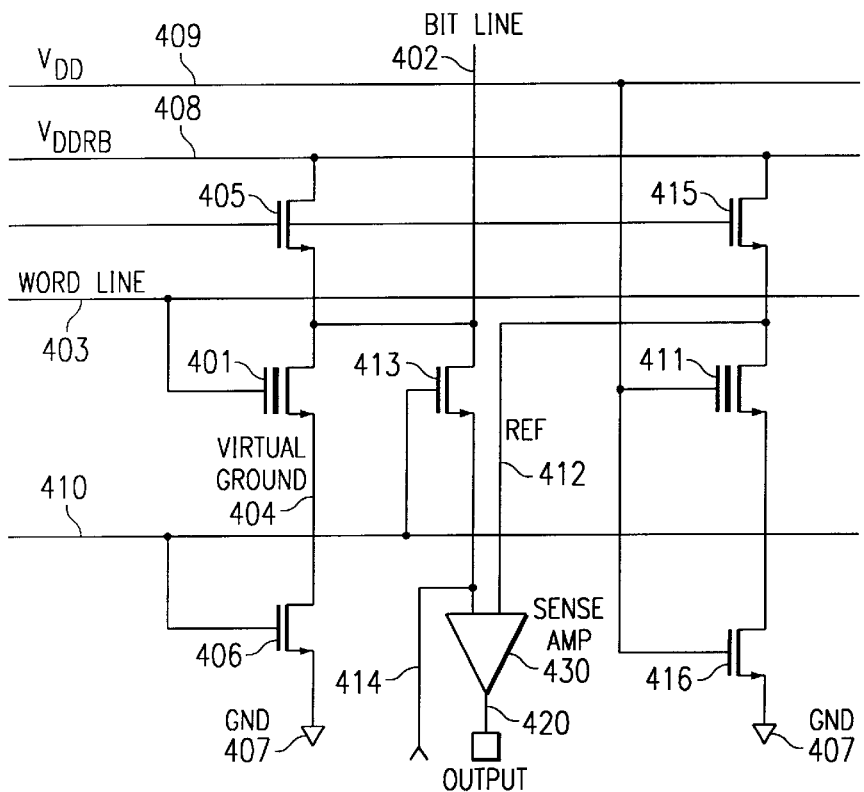
FIG. 4 illustrates a typical FLASH memory circuit configuration of the prior art.

Referring to the circuit configuration of FIG. 4, transistor 401 is the dual gate N-Channel device which is the memory element for a single bit. The bit line for writing data is line 402 and the word select line is line 403. The virtual ground node 404 is switched "on" for write "0" and for read operations and is allowed to float for write "1" and READ operations.

Figure 5:
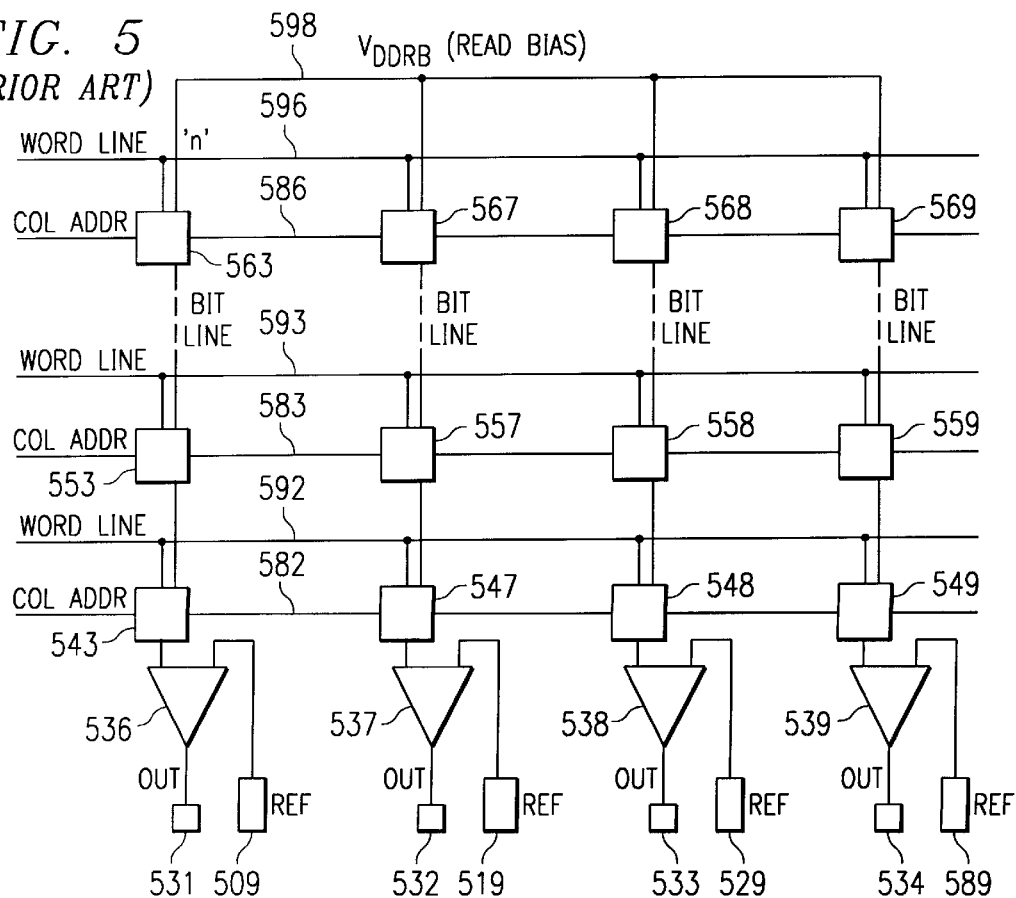
FIG. 5 illustrates the essentials of a prior art array of FLASH memory cells.

FIG. 5 shows a typical array of FLASH memory cells. Sense amplifier 533 is one of typically eight (or sixteen) such sense amplifiers in the array. The blocks 543, 553, 563; 547, 557, 567; 548, 558, 568; and 549, 559, 569 each contain column decoders and sixteen or thirty-two columns of memory elements such as illustrated in FIG. 4.

Figure 6:
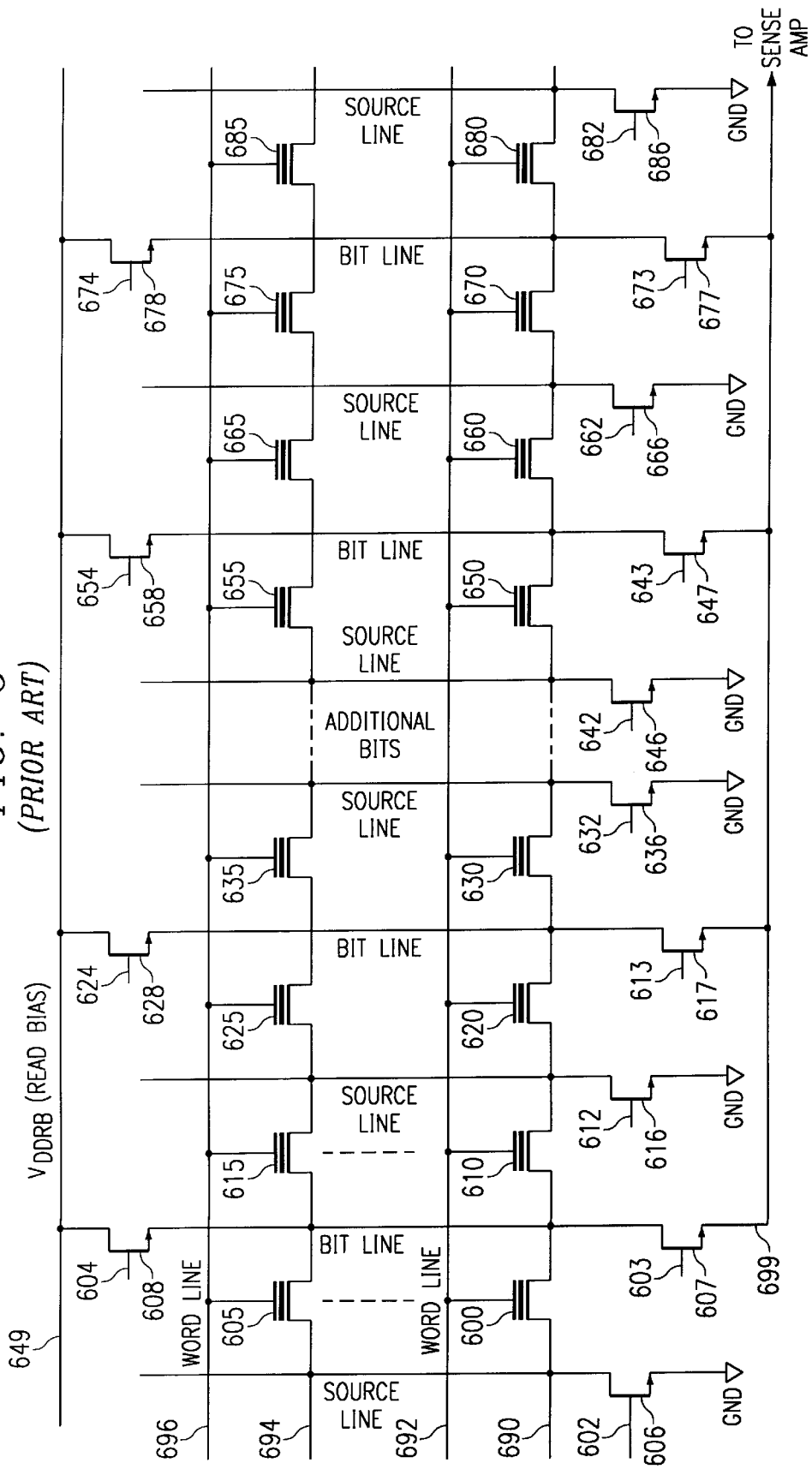
FIG. 6 illustrates the details of transistors and interconnection at the heart of the prior art memory cells.

FIG. 6 shows eight bits in detail, four least significant bits (LSB) and four most significant bits (MSB) of the sixteen or thirty-two bit column group. Two words are shown, word 0 and word N. Transistors 607, 617, 647, and 677 are output transistors driven by the column decoders which electrically connect one of sixteen (or thirty-two) bit lines to the signal input to a corresponding sense amplifier. Source select transistors 606, 616, 636, 646, 666, 686 are driven from column decoders also, and select the "left side bit" (stored in transistor 600, for example) or the "right-side bit" (stored in transistor 610).

Eight (or sixteen) sense amplifiers illustrated by 536, 537, 538, 539 of FIG. 5 collectively form an eight-bit byte (or a sixteen-bit word) portion of the long memory word stored in the FLASH memory. As an example, with thirty-two column groups multiplexed into each sense amplifier, and an array having sixteen sense amplifiers, the word length is 512 bits.

The floating gate N-Channel transistor (401 of FIG. 4) has the characteristics illustrated in FIG. 7. When this transistor has a zero charge on its floating gate, the transistor has the I—V (current-voltage) characteristic of curve "A". With a negative charge "Q$^-$" on the floating gate, the I–V characteristic shifts to curve "B". With a positive charge "Q$^+$" on the floating gate, the I-V characteristic shifts to curve "C".

Programming consists of addressing a particular word line and a particular bit line. An appropriate voltage higher than the normal operational voltage is impressed on that word line. Simultaneously, the addressed bit line is driven with the voltage required to charge the floating gate to value Q$^-$ (FIG. 7) associated with storing the desired logic "0" level. Similarly, channel erasing by block or sector consists of addressing all appropriate bits simultaneously and impressing an appropriate voltage higher than the normal operational voltage on the back gate line while simultaneously driving the word line to zero volts. This results in a charge Q+ (FIG. 7) on the floating gate, thus storing the desired logic "1" level.

Programming and erasing are normally carried out by applying pulses to the word line or the bit line requiring the higher voltage. The appropriate voltages are illustrated in the table of FIG. 8. By convention, the term "programming" is synonymous with writing "0" and "erasing" is synonymous with writing "1".

The "READ (normal verification)" operation shown in FIG. 8 verifies that programming pulses has been successful. If the first group of programming pulses does not yield the desired result, additional pulses (a second pass) may be applied. This frequently will drive the floating gate charge to the desired level. Excessive passes of this type could degrade the device, and thus should be avoided if possible. For this reason, it is highly desirable to use precise methods to verify that an adequate number high voltage pulses have been applied to give the "bit" a robust logic level over all operating conditions, while using no more programming pulses than necessary.

Impressing extreme voltage levels on the device alters the energy bands of the silicon-polysilicon-oxide-nitride interfaces. This enables the so called "fortunate" electrons at the higher end of the energy distribution to scale the energy barrier and transfer charge to or from the floating gate can occur. Under normal voltage stress this floating gate is totally isolated by up to the level of 10$^{12}$ ohm-cm or higher of dielectric resistivity from the other device terminals. Similarly ultra-violet light can be used on wafers or chips packaged in a transparent package to erase the stored logic levels by removing all the charge on the floating gate. This process proceeds by a "hot electron" mechanism in which stored charges are imparted with sufficient energy to simply cause them to "jump" over the containing energy barriers which held them on the floating gate.

The sense amplifier reference circuit of this invention is illustrated in FIG. 9. The transistor 901 is the dual gate N-Channel device which is the memory element for a single bit. The bit line for writing data is line 902 and the word select line is line 903. The virtual ground transistor 906 (drain node 904) is switched "on" for write "0" and read operations and is switched "off", with node 904 rising to +15 volts through a pull-up transistor (not shown) for write "1" operations.

Sense amplifier 930 is the interface element from the bit line 902 and other bit lines which connect to node 914 through other transistors performing a switching function similar to transistor 913. The sense amplifier connects to the output circuitry at node 920. Each bit line has a load pull-up transistor 905 which is sized to one unit gate width "w". This load 905 is connected at its source, to the bit line 902 which is arbitrarily labeled the drain terminal of the floating gate memory element transistor 901. Transistor 913 is driven "on" at the same time as the source select transistor 906, namely, at the time when the bit stored by transistor 901 is being "read".

Transistor 901 (bit "k of word "0" in this example) is in parallel with all like bits (bit "k") in each word of the array, but only one such bit is read because the word line effectively has disconnected all other bits "k" of all other words of the array.

The sense amplifier 930 is connected at its reference input to the weighted loads comprised by transistors 932, 934 and 936, each having a gate width equal to two unit gate widths or 2w. Transistors 911 and 916 are used to balance the reference input 912 of the sense amplifier 930 with the signal input 914 of the sense amplifier. Node 914 is the connecting point for the other bit lines of a group of 16 or thirty-two columns to be detected at the signal input of sense amplifier 930. These are switched in, one at a time, in turn by corresponding transistors such as 913.

During programming (write "0"), erase (write "1"), and verify (READ) for mode margin enhancement, the switched weighted loads are applied according to the prescription of the tables of FIG. 8 and FIG. 11. The conditions for high voltage pulsed signals at the "word" line and "bit" line are given in FIG. 8 for normal write "0" (programming), write "1" (erase) and READ (verify) modes. The number of loads applied at each operation is given in FIG. 11. Note that FIG. 11 identifies the dummy load(s) activated for the three operations above. During normal read operations transistors 932 is "on" at the same time as transistor 905 and transistor 934 is "on" because signal VERA is at the supply voltage VDD, thus providing a load of 4w. Transistor 936 is "off" because VERB is at ground. During verify(0) operations transistors 932 is "on" at the same time as transistor 905 and both transistors 934 and 936 are "on" because the signals VERA and VERB are both at the supply voltage VDD, thus providing a load of 6w. During verify(1) operations only transistors 932 is "on" and both transistors 934 and 936 are "off" because the signals VERA and VERB are both at ground, thus providing a load of 2w. Those skilled in the art would realize that various combinations of transistor channel widths and drive signals could be used to realize the desired loads for these operational modes. The essential feature is that the load for the dummy cell is selected differently for the different operational modes to achieve differing reference voltages at sense amplifier 930.

FIG. 10 shows typical read bias value for a cell to be detected by the sense amplifier. For either logic level to be detected, $V_{DDRB}$ is set to 1.2 volts. For detection of a logical "0" $V_{REF}$ is set above the nominal $V_{REF}$ voltage at $V_{ver\_o}$, slightly less than 1.2 volts. For detection of a logical "1" $V_{REF}$ is set below the nominal $V_{REF}$ voltage at $V_{ver\_1}$, slightly more than 0.8 volts. If the verify(0) operation detects the bit line merely above the reference voltage (1.0 volts), this would be a valid logical "0". If the verify(1) operation detects the bit line merely below the reference voltage (1.0 volts), this would be a valid logical "1". Devices which barely meet these simple pass-fail limits, however have no margin for extreme conditions of operating temperature and power supply tolerance.

For logic levels which would hold over all temperature, power supply and process tolerance variations, for example, correlation data shows that for logical "0" testing it is desirable to set $V_{ver\_0}$ to slightly less than 1.2 volts, and for logical "1" testing it is desirable to set $V_{ver\_1}$ to slightly more than 0.8 volts. This improves margin to extreme conditions of "operating temperature and power supply tolerance" but there remains the possibility that some devices will fail at extreme specification limits.

The present invention makes use of the weighted loads 932 and 934 of FIG. 9 and switches these loads into the sense amplifier reference circuit under the conditions shown in FIG. 11. By so doing, the pass-fail verify tests, verify "1" or verify "0", can be met only after the bit being programmed (or erased) and tested has been charged to a highly robust logic level.

This combination of high level pulsed conditions on the word line or bit line (to achieve a logical "0" or a logical "1" respectively) along with weighted load switching on the sense amplifier reference input is unique to this invention, and guarantees a robust logic state is stored in the FLASH bit. The robust logic state will hold its value over full power supply variations and operating temperature variations.

Although the preferred embodiment has been described in detail, it should be understood that various changes, substitutions and alterations can be made therein without departing from the spirit and scope of the invention as defined by the appended claims.

What is claimed is:

1. A FLASH memory sense circuit comprising:
   a FLASH memory MOS transistor having source-drain path connected between a first sensing terminal and ground, said FLASH memory MOS transistor storing thereon a charge indicative of a digital state;
   a fixed load device connected between said first sensing node and a predetermined voltage;
   a dummy FLASH memory MOS transistor having source-drain path connected between a second sensing terminal and ground;
   a selectable load device connected between said second sensing terminal and said predetermined voltage, said selectable load providing a selectable resistance between said second sensing terminal and said predetermined voltage; and
   a sense amplifier connected to said first and second sensing terminals having an output indicative of which of said first or second sensing terminals has a greater voltage, wherein:
   said selectable load device consists of a plurality of dummy load MOS transistors, each having a source-drain path connected between said second sensing node and said predetermined voltage and a gate connected to receive respective select signals, said selectable load device providing said selectable resistance by predetermined combinations of said select signals turning ON said respective dummy load MOS transistors.

2. The FLASH memory sense circuit of claim 1, wherein:
   said fixed load device consists of a first MOS load transistor having a source-drain path connected between said first sensing terminal and said predetermined voltage and a gate connected to an cell select signal, said first MOS load transistor having a first predetermined channel width; and
   said plurality of dummy load MOS transistors consists of a first dummy load MOS transistor having a second channel width twice said first channel width and a gate connected to said cell select signal,
   a second dummy load MOS transistor having a third channel width twice said first channel width and a gate connected to a first select signal, and
   a third dummy load MOS transistor having a fourth channel width twice said first channel width and a gate connected to a second select signal.

3. The FLASH memory sense circuit of claim 2, wherein:
   said first select signal has a voltage to turn said second dummy load MOS transistor ON and said second select signal has a voltage to turn said third dummy load MOS transistor OFF during normal reading of said FLASH memory;
   said first select signal has a voltage to turn said first dummy load MOS transistor ON and said second select signal has a voltage to turn said second dummy load MOS transistor ON during verification of programming a "0" in said FLASH memory MOS transistor; and
   said first select signal has a voltage to turn said first dummy load MOS transistor OFF and said second select signal has a voltage to turn said second dummy load MOS transistor OFF during verification of programming a "1" in said FLASH memory MOS transistor.

4. A method of operating FLASH memory comprising the steps of:
   disposing a series connection of a FLASH memory MOS transistor and a fixed load between a predetermined voltage and ground, thereby providing a voltage at an intermediate node therebetween;
   comparing said voltage at said intermediate node to a first reference voltage during normal reading of the FLASH memory;
   comparing said voltage at said intermediate node to a second reference voltage during verification of programming a "0" in said FLASH memory MOS transistor; and
   comparing said voltage at said intermediate node to a third reference voltage during verification of programming a "1" in said FLASH memory MOS transistor;
   disposing a first, second and third dummy load MOS transistors between said predetermined voltage and said second intermediate node, said first, second and third dummy load MOS transistors each having a channel width twice a channel width of said fixed load;
   disposing a dummy FLASH memory MOS transistor between said second intermediate node and ground, thereby providing a reference voltage at said second intermediate node;
   said step of generating said first reference voltage consists of supplying signals to gates of said first, second and third dummy load MOS transistors to cause said first and second dummy load MOS transistors to be ON and said third dummy load MOS transistor to be OFF;
   said step of generating said second reference voltage consists of supplying signals to gates of said first, second and third dummy load MOS transistors to cause said first, second and third dummy load MOS transistors to be ON; and
   said step of generating said third reference voltage consists of supplying signals to gates of said first, second and third dummy load MOS transistors to cause said first dummy load MOS transistor to be ON and said second and third dummy load MOS transistors to be OFF.

* * * * *